United States Patent
Sun et al.

(10) Patent No.: US 11,276,460 B2
(45) Date of Patent: Mar. 15, 2022

(54) DYE-SENSITIZED OPTOELECTRONIC MEMORY

(71) Applicant: GLOBALFOUNDRIES Singapore Pte. Ltd, Singapore (SG)

(72) Inventors: Jianxun Sun, Singapore (SG); Juan Boon Tan, Singapore (SG); Tu Pei Chen, Singapore (SG); Eng Huat Toh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 221 days.

(21) Appl. No.: 16/556,729

(22) Filed: Aug. 30, 2019

(65) Prior Publication Data

US 2021/0065788 A1 Mar. 4, 2021

(51) Int. Cl.
| | | |
|---|---|---|
| *H01G 9/00* | (2006.01) | |
| *G11C 11/42* | (2006.01) | |
| *H01L 27/105* | (2006.01) | |
| *H01G 9/04* | (2006.01) | |
| *H01G 9/20* | (2006.01) | |

(52) U.S. Cl.
CPC .......... *G11C 11/42* (2013.01); *H01G 9/0032* (2013.01); *H01G 9/04* (2013.01); *H01G 9/2031* (2013.01); *H01G 9/2059* (2013.01); *H01L 27/1052* (2013.01)

(58) Field of Classification Search
CPC ... G11C 11/42; G11C 13/047; H01L 27/1052; H01G 9/04; H01G 9/2031; H01G 9/0032; H01G 9/2059

See application file for complete search history.

(56) References Cited

U.S. PATENT DOCUMENTS

| | | | | |
|---|---|---|---|---|
| 2012/0012810 A1* | 1/2012 | Thylen | .............. | H01L 27/14609 257/4 |
| 2013/0258765 A1* | 10/2013 | Chen | .................. | G11C 13/0009 365/163 |
| 2019/0305137 A1* | 10/2019 | Sharma | ............. | H01L 27/10897 |

OTHER PUBLICATIONS

Tan et al., "An Optoelectronic Resistive Switching Memory with Integrated Demodulating and Arithmetic Functions", Advanced Materials, vol. 27, Issue17, May 6, 2015, pp. 2797-2803.
Tan et al., "Light-Gated Memristor with Integrated Logic and Memory Functions", ACS Nano 2017, 11, 11, 11298-11305, Publication Date: Oct. 13, 2017.
Zhou et al., "Low-Voltage, Optoelectronic CH3NH3Pbl3-xClx Memory with Integrated Sensing and Logic Operations", Advanced Functional Materials, vol. 28, Issue 15, Apr. 11, 2018.
Lei et al., "Optoelectronic Memory Using Two-Dimensional Materials", Nano Lett. 2015, 15, 1, 259-265 Publication Date: Dec. 17, 2014.
Xiang, et al., "Two-dimensional multibit optoelectronic memory with broadband spectrum distinction", Nature Communicationsvol. 9, Article No. 2966 (2018).

* cited by examiner

*Primary Examiner* — Mohammed A Bashar
(74) *Attorney, Agent, or Firm* — Thompson Hine LLP

(57) ABSTRACT

Structures for an optoelectronic memory and related fabrication methods. A metal oxide layer is located on an interlayer dielectric layer. A layer composed of a donor/acceptor dye is positioned on a portion of the first layer.

20 Claims, 3 Drawing Sheets

DYE-SENSITIZED OPTOELECTRONIC MEMORY

BACKGROUND

The invention relates generally to semiconductor device and integrated circuit fabrication and, in particular, to structures for an optoelectronic memory and related fabrication methods.

Optoelectronic memories are devices that can store photon-generated charge carriers when exposed to light. The stored charges can be accessed at a later time for information retrieval. The optical switching time for optoelectronic memories is slow, which has limited their implementation in practical applications of the technology. In addition, optoelectronic memories cannot operate in a pure optical switching mode because of the absence of optical erase functionality.

Improved structures for an optoelectronic memory and related fabrication methods are needed.

SUMMARY

In an embodiment of the invention, a structure for an optoelectronic memory is provided. The structure includes an interlayer dielectric layer, a first layer on the interlayer dielectric layer, and a second layer on a portion of the first layer. The first layer is composed of a metal oxide, and the second layer is composed of a donor/acceptor dye.

In an embodiment of the invention, a method of forming a structure for an optoelectronic memory is provided. The method includes forming an interlayer dielectric layer, forming a first layer on the interlayer dielectric layer, and forming a second layer on a portion of the first layer. The first layer is composed of a metal oxide, and the second layer is composed of a donor/acceptor dye.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
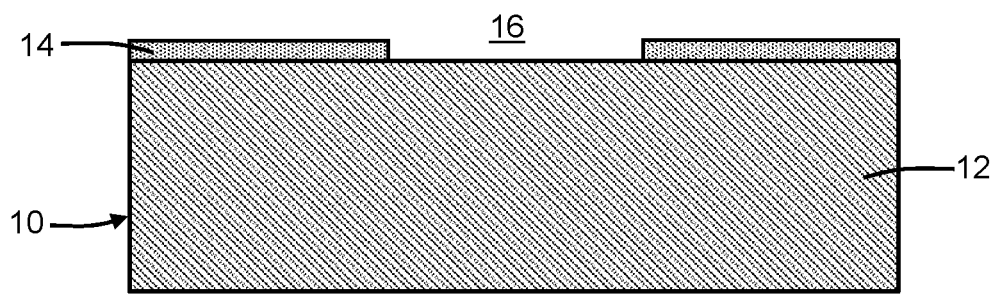
FIGS. 1-3 are cross-sectional views of a structure at successive fabrication stages of a processing method in accordance with embodiments of the invention.

With reference to FIG. 1 and in accordance with embodiments of the invention, a metallization level 10 of an interconnect structure formed by back-end-of-line (BEOL) processing includes an interlayer dielectric layer 12. The interlayer dielectric layer 12 may be composed of a dielectric material, such as silicon dioxide, silicon nitride, or SiCOH, deposited by chemical vapor deposition. A structure for a bitcell of an optoelectronic memory is formed over the interlayer dielectric layer 12 as subsequently described. To that end, a layer 14 is deposited on the interlayer dielectric layer 12 and patterned using lithography and etching processes to form an opening 16 penetrating through the layer 14. The layer 14 may be composed of a metal, such as aluminum, copper, tantalum, tantalum nitride, or a silicide, that may be deposited by sputter-deposition. A portion of the interlayer dielectric layer 12 is exposed by the opening 16.

Figure 2:
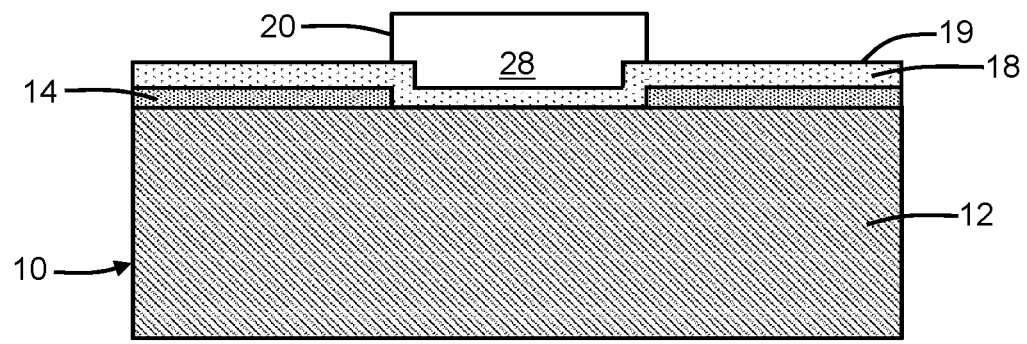

With reference to FIG. 2 in which like reference numerals refer to like features in FIG. 1 and at a subsequent fabrication stage of the processing method, a layer 18 is deposited that is positioned on the layer 14 and on the portion of the interlayer dielectric layer 12 exposed by the opening 16. The layer 18 may be composed of a metal oxide, such as titanium oxide, deposited by sputter-deposition. The material of the layer 18 may be engineered to contain electron traps. For example, the composition of the layer 18 may be metal-rich (e.g., titanium-rich) to provide vacancies that function as trapping centers for electrons. In alternative embodiments, the layer 18 may be composed of a different metal oxide, such as tin oxide or zinc oxide, also capable of providing vacancies that function as trapping centers for electrons. The layer 18 may include a recess 28 that forms at the location of the opening 16 (FIG. 1) and coincides in position with the location of the opening 16. The recess 28 is located above the portion of the interlayer dielectric layer 12 exposed by the opening 16.

A treatment mask 20 is formed by a lithography process over a portion of the layer 18 associated with the recess 28 in the layer 18. The treatment mask 20, which fully covers the portion of the layer 18, may overlap at its peripheral edges with portions of the layer 18 proximate to the recess 28. The treatment mask 20 may include a layer of, for example, an organic photoresist that is applied by a spin coating process, pre-baked, exposed to light projected through a photomask, baked after exposure, and developed with a chemical developer.

The layer 18 is then surface treated to change the adsorption properties of its surface 19 surrounding the portion of the layer 18 covered by the treatment mask 20. The treatment mask 20 blocks exposure of the layer 18 locally within the recess 28 to the surface treatment. The surface adsorption of the exposed portion of the layer 18 may be decreased by the surface treatment. In an embodiment, the surface adsorption of the exposed portion of the layer 18 may be reduced by exposure to an oxygen plasma as the surface treatment. The working conditions for the oxygen plasma treatment may be a plasma power of five (5) watts to fifteen (15) watts, five (5) mL/min to thirty (30) mL/min oxygen flow, one (1) Torr to ten (10) Torr chamber pressure, and a duration of thirty (30) seconds to sixty (60) seconds. The treatment mask 20 may be stripped, following the surface treatment, by a wet clean and dehydration bake to remove —OH bonds to provide free surface-adsorption sites only where masked during the surface treatment.

In an alternative embodiment, the layer 16 may be omitted from the device construction, which results in the elimination of the recess 28 in the layer 18. The treatment mask 20 covers an area on the planar top surface 19 of the layer 18 that is protected during the surface treatment.

Figure 3:
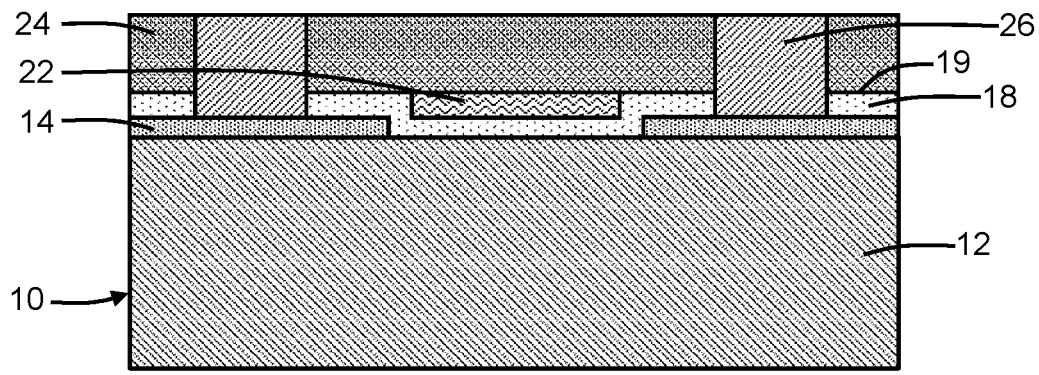

With reference to FIG. 3 in which like reference numerals refer to like features in FIG. 2 and at a subsequent fabrication stage of the processing method, a layer 22 containing dye molecules is formed by adsorption on the portion of the layer 18 formerly covered by the treatment mask 20 (FIG. 2). The layer 22 does not form by adsorption over the surface-treated portions of the layer 18 that surround the recess 28. The dye molecules used to form the layer 22 may be provided in a solution containing, for example, ethanol.

In an embodiment, the layer 22 may be formed by soaking in the solution. The dye molecules from the solution selectively adsorb from the solution to the portion of the layer 18 that did not receive the prior surface treatment, and the dye molecules are selectively repelled by the portions of the layer 18 with reduced adsorpability surrounding the recess 28. The dye molecules attach to surface 19 of the non-treated portion of the layer 18, followed by cleaning and drying. In an embodiment, a monolayer or a fraction of a monolayer of the dye molecules may adsorb on the non-treated portion of the layer 28 to form the layer 22.

The dye contained in layer 22 may be a donor/acceptor dye. In that regard, the dye molecules contained in the layer 22 may be capable of releasing charge carriers (e.g., electrons) in response to receiving light (i.e., electromagnetic radiation) within a given wavelength band, that are donated to the layer 18, or accepting and capturing free charge carriers that are released by the layer 18 in response to receiving light within a different wavelength band. In an embodiment, the dye molecules contained in the layer 22 may be a metalorganic substance. In an embodiment, the dye contained in layer 22 may be a metal-complex organic dye, such as N3 standard dye or N719 standard dye. In an embodiment, the dye contained in layer 22 may be a ruthenium-based organic dye. In an embodiment, the dye contained in layer 22 may be a metal-free organic dye, such as C278 or C275.

An encapsulation layer 24 is formed over the layer 18 and the layer 22. The encapsulation layer 24 may be composed of an insulating polymer, such as a silicon-based organic polymer (e.g., polydimethylsiloxane (PDMS)), that is light transmissive (e.g., transparent) and that may be cured at room temperature. Contacts 26 are formed in contact openings patterned in the encapsulation layer 24 by lithography and etching processes. The contacts 26 are coupled to different portions of the layer 14, as well as to different portions of the layer 18.

The completed device structure defines a bitcell for an optoelectronic memory. The dye molecules in the layer 22 provide a reservoir that can supply electrons that are trapped by the layer 18 to provide a high-resistance memory state, and that can receive electrons from the layer 18 to provide a low-resistance memory state. The memory states may be programmed and erased at a fast speed (e.g., picoseconds) to provide a significantly reduced switching time in comparison with a conventional optoelectronic memory bitcell.

The material of the layer 18 has a band gap characterized by a conduction band minimum (Ecm) and a valence band maximum (Evm). The dye molecules in the layer 22 are characterized by a highest occupied molecular orbital (HOMO) with an energy level and a lowest unoccupied molecular orbital (LUMO) with an energy level. The energy level of the lowest unoccupied molecular orbital of the dye molecules in layer 22 is greater than the energy level of the conduction band minimum of the material of layer 18. As a result, the exposure of layer 22 to light of a given wavelength can promote electron injection from the dye molecules to the layer 18, which traps the injected electrons. For example, a femtosecond pulse of green light ($\lambda p=540$ nm) from a laser may be used to program the optoelectronic device. Similarly, the exposure of the layer 18 to light of a given wavelength can promote electron detrapping and transfer of the detrapped electrons from the layer 18 to the dye molecules of layer 22. For example, a femtosecond pulse of red light ($\lambda e=700$ nm) from a laser may be used to erase the optoelectronic device.

The interlayer dielectric layer 12 and the encapsulation layer 24 cooperate to confine the generated mobile electrons to the layers 18, 22. The material of the interlayer dielectric layer 12 has a conduction band potential that is greater than the energy level of the lowest unoccupied molecular orbital of the dye molecules in layer 22 and the energy level of the conduction band minimum of the material of layer 18. The material of encapsulation layer 24 has a lowest unoccupied molecular orbital that is greater than the energy level of the lowest unoccupied molecular orbital of the dye molecules in layer 22 and the energy level of the conduction band minimum of the material of layer 18.

In use, the optoelectronic device structure may be optically programmed by exposing the layer 22 to an optical pulse containing light of a given wavelength (e.g., 540 nm) that promotes electron injection from the dye molecules into the conduction band of the layer 18. The injected electrons are trapped by the layer 18, which increases the electrical resistance of the layer 18 between the contacts 26. For example, the injected electrons may be trapped by oxygen vacancies in the layer 18. The steady-state condition with light absent provides a high electrical resistance state. The optoelectronic device structure may be erased by exposing the layer 18 to an optical pulse containing light of a given wavelength (e.g., 700 nm) that promotes electron injection from the layer 18 to the dye molecules and, thereby, detraps the electrons for transfer to the layer 22. The transferred electrons recombine with holes in the highest occupied molecular orbital of the dye molecules. The wavelength of the light used to erase the device structure is different than the wavelength of the light used to program the device structure. The transferred electrons lower the electrical resistance of the layer 22, which provides a low electrical resistance state in a steady-state condition with light absent.

The number of the trapped electrons and de-trapped electrons may be controlled by the light wavelength, light intensity, and/or the number of light pulses. The resistance state of the optoelectronic device structure is controlled by the number of trapped electrons and the number of de-trapped electrons. Signal sensing, data storage, and processing can be integrated into a single, compact device structure resembling a memristor that possesses the ability to be programmed multiple times. The resistance state of the optoelectronic device structure can be electrically read by applying a picosecond electrical pulse between the contacts 26.

Figure 4:
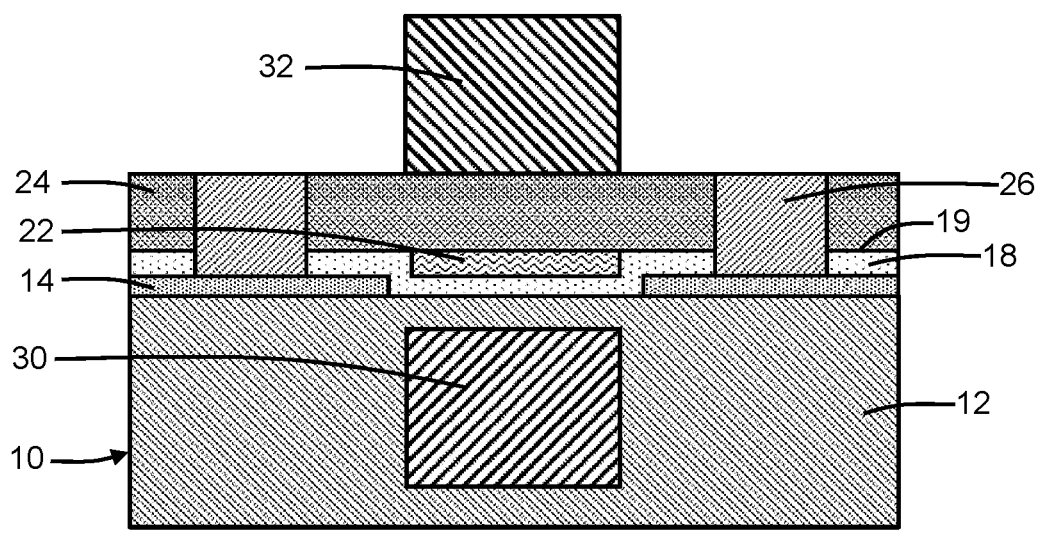
FIG. 4 is a cross-sectional view of a structure in accordance with alternative embodiments of the invention.

With reference to FIG. 4 in which like reference numerals refer to like features in FIG. 3 and in accordance with alternative embodiments, the optoelectronic device structure may be modified to include an electrode 30 provided below the layer 22 in the recess 28 and an electrode 32 provided above the layer 22 in the recess 28. The layer 22 is disposed between the electrode 30 and the electrode 32, and the layer 22 at least partial overlaps with each of the electrodes 30, 32. In an embodiment, each of the electrodes 30, 32 may fully laterally overlap with the layer 22. The electrode 30 may be formed before the optoelectronic device structure is formed, and the electrode 32 may be formed after the optoelectronic device structure is formed.

The electrode 30 is a metal feature composed of a metal, such as aluminum, copper, tantalum, tantalum nitride or a silicide, that may be deposited in an opening formed in the interlayer dielectric layer 12 by lithography and etching processes, planarized, and then buried within the interlayer dielectric layer 12 by depositing additional dielectric material. The electrode 32 may be composed of a conductor that is deposited as a layer and shaped by lithography and etching processes. The conductor of the electrode 32 is preferably light transmissive (e.g., transparent to the passage of light). In an embodiment, the electrode 32 may be composed of indium tin oxide. Alternatively, the electrode 32 may be composed of aluminum-doped zinc oxide or fluorine-doped tin oxide.

In use, the electrodes 30, 32 may be used to assist with programming and erasing the optoelectronic device structure. During assisted programming, an electrical pulse may be applied to the electrodes 30, 32 concurrently with the light pulse. The electrical pulse is applied with the negative terminal of the bias supply connected to the electrode 32 and the positive terminal of the bias supply connected to the electrode 30. The electrical biasing during programming assists the light pulse applied to the layer 22 to transfer electrons to the layer 18 and thereby provide the high resistance state. The electrical biasing during erasure may cause de-trapping of the charge carriers from the layer 18 and may be applied concurrently with light exposure. The electrical pulse is applied with the negative terminal of the bias supply connected to the electrode 30 and the positive terminal of the bias supply connected to the electrode 32. In an alternative embodiment, the electrical biasing alone may be used to provide the low resistance state.

Figure 5:
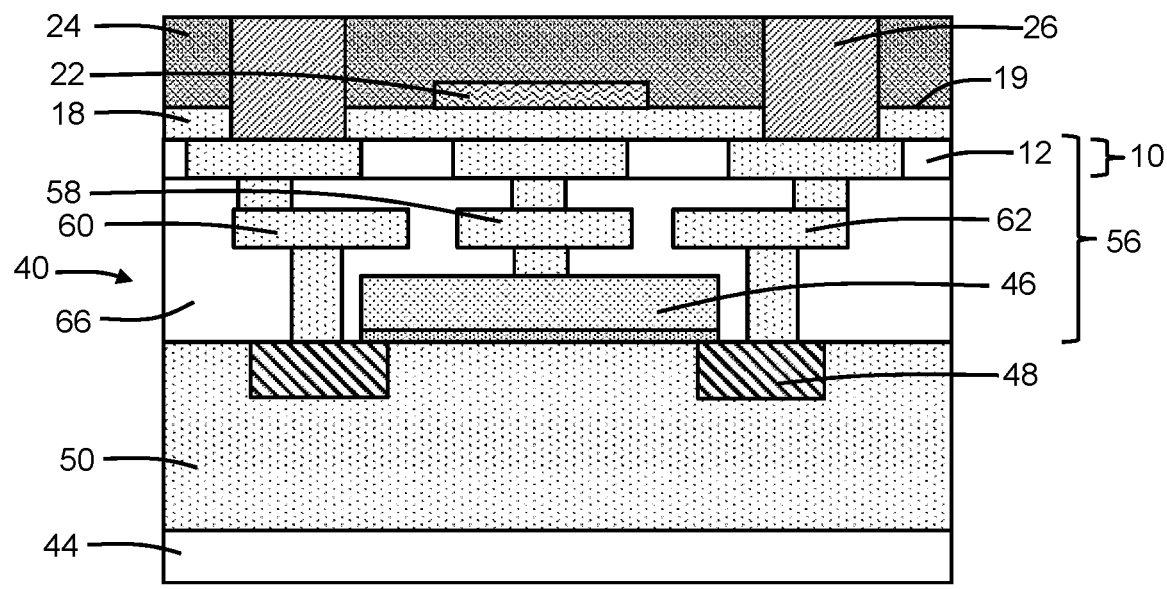
FIGS. 5 and 6 are cross-sectional views of a structure in accordance with alternative embodiments of the invention.
Figure 6:
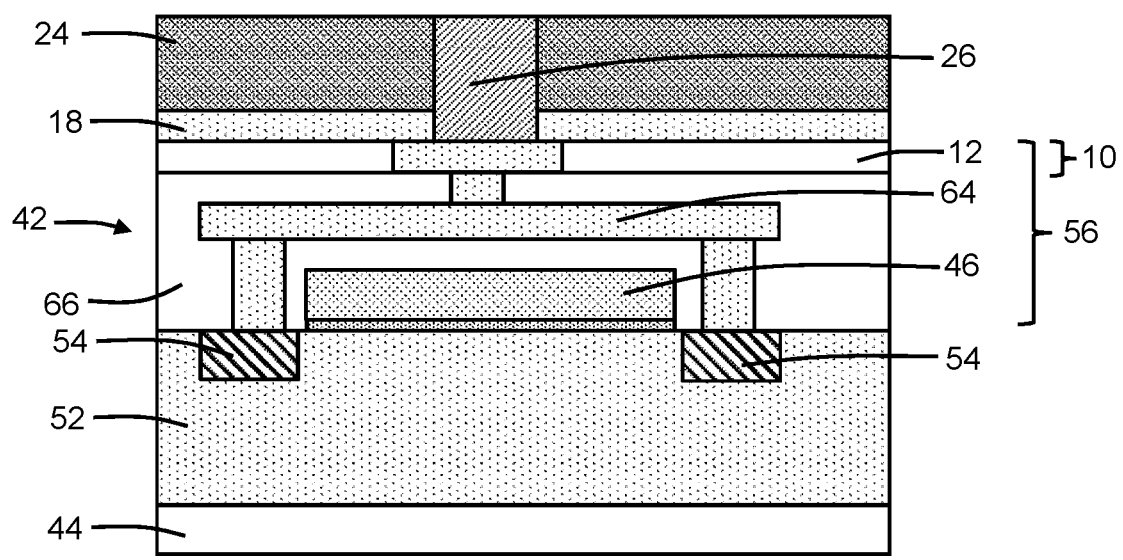

With reference to FIGS. 5, 6 in which like reference numerals refer to like features in FIG. 3 and in accordance with alternative embodiments, the optoelectronic device structure may be coupled with a field-effect transistor 40 and a coupling capacitor 42 to improve current sensing when reading the state of the optoelectronic device structure. The field-effect transistor 40 and coupling capacitor 42 may be formed in different electrically-isolated sections of a substrate 44.

The field-effect transistor 40 may be fabricated using the substrate 44 by front-end-of-line processing. The field-effect transistor 40 may include a gate electrode 46 and a gate dielectric formed by depositing a layer stack and patterning the layer stack with photolithography and etching. The gate electrode 46 may be composed of a gate conductor, such as doped polycrystalline silicon (i.e., polysilicon) or a work function metal, and the gate dielectric may be composed of an electrical insulator, such as silicon dioxide or hafnium oxide. The field-effect transistor 40 may include other elements such as source/drain regions 48 located in a well 50, silicide on the source/drain regions 48, halo regions, lightly doped drain (LDD) extensions, and non-conductive sidewall spacers on the gate electrode 46. As used herein, the term "source/drain region" means a doped region of semiconductor material that can function as either a source or a drain of the field-effect transistor 40.

The coupling capacitor 42 may also be fabricated using the substrate 44 by front-end-of-line processing. The coupling capacitor 42 may share the gate electrode 46 of the field-effect transistor 40 to provide an electrode that is connected to the field-effect transistor 40. The coupling capacitor 42 includes a well 52 of opposite conductivity type to the well 50, as well as doped regions 54 that provide locations of reduced resistance for establishing connections to the well 52. The metallization 64 provides another electrode of the coupling capacitor 42.

An interconnect structure 56 is formed by middle-of-line (MOL) processing and back-end-of-line (BEOL) processing over the field-effect transistor 40 and coupling capacitor 42. The interconnect structure 56 includes metallization 58 coupled to the gate electrode 46 of the field-effect transistor 40, metallization 60, 62 coupled to the source/drain regions 48 of the field-effect transistor 40, and metallization 64 coupled to the doped regions 54 of the coupling capacitor 42. The metallization 58 includes a metal feature arranged immediately below the layer 22 and immediately above the gate electrode 46 of the field-effect transistor 40. The metallization 60 couples one of the source/drain regions 48 of the field-effect transistor 40 to a portion of the layer 18, and the metallization 62 couples the other of the source/drain regions 48 of the field-effect transistor 40 to a different portion of the layer 18. The metallization 64 couples the well 52 and doped regions 54 to a portion of the layer 18.

The interconnect structure 56 includes multiple metallization levels in which the metallization 58, 60, 62, 64 is formed, and the interconnect structure 56 also includes the metallization level 10 over which the bitcell for the optoelectronic memory (FIG. 3) is formed as previously described. The metallization levels 58, 60, 62, 64 of the interconnect structure 56 are formed in one or more interlayer dielectric layers 66. The metallization 58, 60, 62, 64 of the interconnect structure 56 may include contacts, as well as vias, metal lines, and/or metal islands as metallization features that are coupled with the contacts. The contacts may be composed of a metal, such as silicide and/or tungsten, the interlayer dielectric layers 66 may be composed of a dielectric material, such as carbon-doped silicon dioxide, and the metallization 58, 60, 62, 64 may include features composed of copper, aluminum, and/or cobalt.

The coupling capacitor 42 is configured to drive the field-effect transistor 40. During programming in response to an optical pulse, the coupling capacitor 42 is configured to turn on the field-effect transistor 40. The threshold voltage of the field-effect transistor 40 may increase due to rising of the electron potential and amplify the current generated by the optoelectronic device structure during programming. During erasure in response to an optical pulse, the coupling capacitor 42 is also configured to turn on the field-effect transistor 40. The threshold voltage of the field-effect transistor 40 may decrease due to the falling of the electron potential during erasure. The combination of the coupling capacitor 42 and the field-effect transistor 40 may effectively increase the sensing window of the optoelectronic device structure because of the current amplification effect of the transistor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an optoelectronic memory, the structure comprising:
   a first interlayer dielectric layer;
   a first layer on the first interlayer dielectric layer, the first layer comprised of a metal oxide; and
   a second layer on a portion of the first layer, the second layer comprised of an organic donor/acceptor dye,
   wherein the organic donor/acceptor dye is a ruthenium-based organic dye, and the metal oxide is titanium oxide.

2. The structure of claim 1 further comprising:
   a third layer disposed on the first interlayer dielectric layer beneath the first layer, the third layer including an opening that surrounds the portion of the first layer, and the third layer comprised of a metal.

3. The structure of claim 2 wherein the portion of the first layer includes a recess inside the opening in the third layer, and the second layer is located in the recess over the first layer.

4. The structure of claim 2 further comprising:
   a first contact coupled to the first layer and to a first portion of the third layer; and
   a second contact coupled to the first layer and to a second portion of the third layer,
   wherein the portion of the first layer and the second layer are laterally positioned between the first contact and the second contact.

5. The structure of claim 1 wherein the portion of the first layer is in direct contact with the first interlayer dielectric layer.

6. The structure of claim 1 further comprising:
   a first electrode in the first interlayer dielectric layer; and
   a second electrode over the portion of the first layer,
   wherein the second layer is positioned between the first electrode and the second electrode.

7. The structure of claim 6 wherein the second electrode is comprised of a conductor that is light transmissive.

8. The structure of claim 7 further comprising:
   an encapsulation layer positioned between the second electrode and the second layer, the encapsulation layer comprised of an insulating polymer that is light transmissive.

9. A structure for an optoelectronic memory, the structure comprising:
   a first interlayer dielectric layer;
   a first layer on the first interlayer dielectric layer, the first layer comprised of a metal oxide;
   a second layer on a portion of the first layer, the second layer comprised of a donor/acceptor dye; and
   a field-effect transistor having a drain coupled to a first portion of the first layer, a source coupled to a second portion of the first layer, and a gate electrode,
   wherein the second layer is laterally positioned between the first portion of the first layer and the second portion of the first layer.

10. The structure of claim 9 further comprising:
    a coupling capacitor having a first electrode coupled to the gate electrode of the field-effect transistor.

11. The structure of claim 10 wherein the coupling capacitor has a second electrode coupled to the first layer.

12. The structure of claim 9 further comprising:
    a second interlayer dielectric layer over the first interlayer dielectric layer; and
    a metal feature in the second interlayer dielectric layer, the metal feature positioned proximate to the second layer, and the metal feature coupled to the gate electrode of the field-effect transistor.

13. A method of forming a structure for an optoelectronic memory, the method comprising:
    forming an interlayer dielectric layer;
    forming a first layer on the interlayer dielectric layer, wherein the first layer is comprised of a metal oxide, and the metal oxide is titanium oxide; and
    forming a second layer on a first portion of the first layer, wherein the second layer is comprised of an organic donor/acceptor dye, and the organic donor/acceptor dye is a ruthenium-based organic dye.

14. The method of claim 13 further comprising:
    forming a field-effect transistor having a drain coupled to a second portion of the first layer, a source coupled to a third portion of the first layer, and a gate electrode,
    wherein the second layer is laterally positioned between the second portion of the first layer and the third portion of the first layer.

15. The method of claim 14 further comprising:
    forming a coupling capacitor having a first electrode coupled to the gate electrode of the field-effect transistor.

16. The method of claim 13 wherein forming the second layer on the first portion of the first layer further comprises:
    masking the first portion of the first layer with a treatment mask; and
    after the first portion of the first layer is masked, performing a surface treatment of a second portion of the first layer surrounding the first portion of the first layer,
    wherein the surface treatment reduces surface adsorption of the organic donor/acceptor dye to the second portion of the first layer.

17. The method of claim 13 further comprising:
    forming a first electrode in the interlayer dielectric layer; and
    forming a second electrode over the first portion of the first layer, wherein the second layer is positioned between the first electrode and the second electrode.

18. The structure of claim 9 wherein the donor/acceptor dye is a ruthenium-based organic dye, and the metal oxide is titanium oxide.

19. The structure of claim 9 wherein the donor/acceptor dye is a metal-free organic dye, and the metal oxide is titanium oxide.

20. The structure of claim 9 wherein the donor/acceptor dye is a metal-complex organic dye, and the metal oxide is titanium oxide.

* * * * *